(12) United States Patent
Chow et al.

(10) Patent No.: US 9,459,154 B2
(45) Date of Patent: Oct. 4, 2016

(54) MULTI-LAYER ADVANCED CARBON NANOTUBE BLACKBODY FOR COMPACT, LIGHTWEIGHT, AND ON-DEMAND INFRARED CALIBRATION

(71) Applicant: Raytheon Company, Waltham, MA (US)

(72) Inventors: James R. Chow, San Gabriel, CA (US); Kurt S. Ketola, Los Angeles, CA (US); David M. La Komski, Long Beach, CA (US); Carl W. Townsend, Los Angeles, CA (US); William E. Elias, Manhattan Beach, CA (US); Stuart J. Marble, Westchester, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/548,135

(22) Filed: Nov. 19, 2014

(65) Prior Publication Data

US 2015/0076373 A1   Mar. 19, 2015

Related U.S. Application Data

(63) Continuation-in-part of application No. 13/894,953, filed on May 15, 2013.

(51) Int. Cl.
| | | |
|---|---|---|
| G01D 18/00 | (2006.01) | |
| G01J 5/52 | (2006.01) | |
| H01L 51/00 | (2006.01) | |
| H01L 29/06 | (2006.01) | |

(52) U.S. Cl.
CPC ............ *G01J 5/522* (2013.01); *H01L 29/0673* (2013.01); *H01L 51/0048* (2013.01); *Y10S 977/949* (2013.01)

(58) Field of Classification Search
CPC ......... G01J 5/522; G01J 5/023; H01L 27/14; H01L 29/06
See application file for complete search history.

(56) References Cited

U.S. PATENT DOCUMENTS

| | | |
|---|---|---|
| 3,006,978 A | 10/1961 | McGrath et al. |
| 4,378,489 A | 3/1983 | Chabinsky et al. |
| 4,647,783 A | 3/1987 | Verona |

(Continued)

FOREIGN PATENT DOCUMENTS

| | | |
|---|---|---|
| CN | 1752724 A | 3/2006 |
| KR | 20130106932 A | 10/2013 |
| WO | 2014186026 A1 | 11/2014 |

OTHER PUBLICATIONS

"Thermal properties of graphene: Fundamentals and applications", MRS Bulletin, vol. 37, Dec. 2012, p. 1273-1281 to Pop et al.*

(Continued)

*Primary Examiner* — David J Makiya
*Assistant Examiner* — Kenneth J Malkowski
(74) *Attorney, Agent, or Firm* — Cantor Colburn LLP

(57) ABSTRACT

An apparatus, method and thin-film structure for producing a blackbody spectrum is disclosed. A first layer of the apparatus is configured to generate heat in response to an applied voltage. A second layer is configured to emit the blackbody radiation spectrum in response to the heat from the first layer. A thermal spreading layer is disposed between the first layer and the second layer. The thermal spreading layer includes a graphene sheet for reducing a spatial variation of the heat in a plane of the thermal spreading layer.

20 Claims, 6 Drawing Sheets

(56) References Cited

U.S. PATENT DOCUMENTS

| | | |
|---|---|---|
| 4,750,139 A | 6/1988 | Dils |
| 6,072,165 A | 6/2000 | Feldman |
| 8,033,722 B2 | 10/2011 | Kulkarni et al. |
| 9,086,327 B2 | 7/2015 | Chow et al. |
| 2004/0207845 A1 | 10/2004 | Opsal |
| 2007/0210265 A1* | 9/2007 | Haq et al. .................. 250/493.1 |
| 2008/0036356 A1 | 2/2008 | Ward |
| 2010/0059494 A1 | 3/2010 | Keite-Telgenbuescher |
| 2010/0108916 A1 | 5/2010 | Barker |
| 2010/0260229 A1 | 10/2010 | Grubb |
| 2011/0103424 A1* | 5/2011 | Imholt ............................ 374/45 |
| 2011/0298333 A1 | 12/2011 | Pilon |
| 2012/0073308 A1 | 3/2012 | Kim |
| 2012/0199689 A1 | 8/2012 | Burkland |
| 2013/0043390 A1 | 2/2013 | De Ruyter |
| 2013/0048884 A1 | 2/2013 | Fainchtein et al. |
| 2013/0087758 A1 | 4/2013 | Maki et al. |
| 2013/0153860 A1 | 6/2013 | Kim et al. |
| 2013/0220990 A1* | 8/2013 | Liu ........................ H01J 29/20 219/475 |
| 2013/0329366 A1 | 12/2013 | Wang et al. |
| 2014/0292357 A1* | 10/2014 | Chai ............................. 324/693 |

OTHER PUBLICATIONS

"Synthesis of Large Area, Homogeneous, Single Layer Graphene Films by Annealing Amorphous Carbon on Co and Ni", Nano Res. 2011, 4(6): 531-540 to Orofeo et al.*

International Search Report for International Application No. PCT/US2014/018928; International Filing Date Feb. 27, 2014; Mail Date Aug. 11, 2014. (7 pages).

Written Opinion for International Application No. PCT/US2014/018928; International Filing Date Feb. 27, 2014; Mail Date Aug. 11, 2014. (7 pages).

Konz et al.; "Micromachined IR-source with excellent blackbody like behaviour", Invited Paper, Proceedings of SPIE vol. 5836, Jul. 1, 2005, pp. 540-548.

PCT International Search Report and Written Opinion; International Application No. PCT/US2015/060526; International Filing Date: Nov. 13, 2015; Date of Mailing: Mar. 7, 2016; pp. 1-15.

* cited by examiner

| CONSTANT CURRENT (A) | TARGET TEMP(K) | MEASURED TEMPERATURES (KELVIN) | | |
|---|---|---|---|---|
| | | 10 SEC | 60 SEC | 180 SEC |
| 1 | 300 | 306 ± 1 | 307 ± 1 | 307 ± 1 |
| 3 | 353 | 348 ± 6 | 351 ± 3 | 351 ± 2 |
| 5 | 433 | 435 ± 7 | 435 ± 7 | 439 ± 4 |
| 8 | 515 | 526 ± 5 | 525 ± 7 | 525 ± 5 |

FIG. 5

MULTI-LAYER ADVANCED CARBON NANOTUBE BLACKBODY FOR COMPACT, LIGHTWEIGHT, AND ON-DEMAND INFRARED CALIBRATION

CROSS REFERENCE TO RELATED APPLICATIONS

The present application is a continuation-in-part of U.S. application Ser. No. 13/894,953, filed on May 15, 2013.

BACKGROUND

The present disclosure relates to generating a radiation spectrum and, in particular, to a method and apparatus for generating blackbody radiation spectra.

In various optical systems, an optical signal is received from an object at an optical sensor and measurements of the optical signal are obtained at the optical sensor to determine a property of the object. In order to obtain accurate measurements, it is often necessary to calibrate the optical sensor using a known photon flux at one or more standard wavelengths. One method for providing the photon flux at standard wavelengths includes heating one or more blackbody radiators to selected temperatures and using optical filters to select the calibration wavelength. However, the use of blackbody sources to calibrate an optical sensor introduces size, weight, and power (SWaP) challenges. First of all, a conventional blackbody radiator needs to be heated for a relatively long time prior to use in calibration in order to bring the blackbody radiator to the selected temperature and to maintain the selected temperature. Conventional blackbody sources therefore consume a large amount of power. Secondly, conventional blackbody sources and their supporting optical structures are generally bulky, and using one or more of them requires a precise optical mechanism to image each blackbody emission spectrum onto the sensor undergoing calibration. Third, such a blackbody radiator calibration system and its accompanying optical mechanisms are generally heavy and cumbersome.

SUMMARY

According to one embodiment of the present disclosure, an apparatus for producing a blackbody spectrum includes: a first layer configured to generate heat in response to an applied voltage; a second layer configured to emit the blackbody radiation spectrum in response to the heat from the first layer; and a thermal spreading layer between the first layer and the second layer, the thermal spreading layer including a graphene sheet for reducing a spatial variation of the heat in a plane of the thermal spreading layer.

According to another embodiment of the present disclosure, a film for generating a blackbody radiation spectrum includes: a first layer configured to generate heat in response to an applied voltage; a second layer configured to emit the blackbody radiation spectrum in response to the heat from the first layer; and a thermal spreading layer between the first carbon nanotube layer and the second carbon nanotube layer, the thermal spreading layer including a graphene sheet for reducing a spatial variation of the heat in a plane of the thermal spreading layer.

According to another embodiment of the present disclosure, a method of producing a blackbody radiation spectrum includes: applying a voltage to a first layer of a thin film device comprising the first layer, a second layer and at least one graphene sheet disposed between the first layer and the second layer in order to generate heat at the first layer; and using the at least one graphene sheet to reduce a spatial variation of the heat in the plane of the thin film device, wherein the heat having the reduced spatial variation excites photons at the second layer to produce the blackbody radiation spectrum.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter which is regarded as the disclosure is particularly pointed out and distinctly claimed in the claims at the conclusion of the specification. The forgoing and other features, and advantages of the disclosure are apparent from the following detailed description taken in conjunction with the accompanying drawings in which:

FIG. 5 shows a table illustrating a relation between current supplied to the exemplary carbon nanotube film of FIG. 4 and resulting spatial and temporal equilibrium temperatures of the carbon nanotube film.

DETAILED DESCRIPTION

Figure 1:
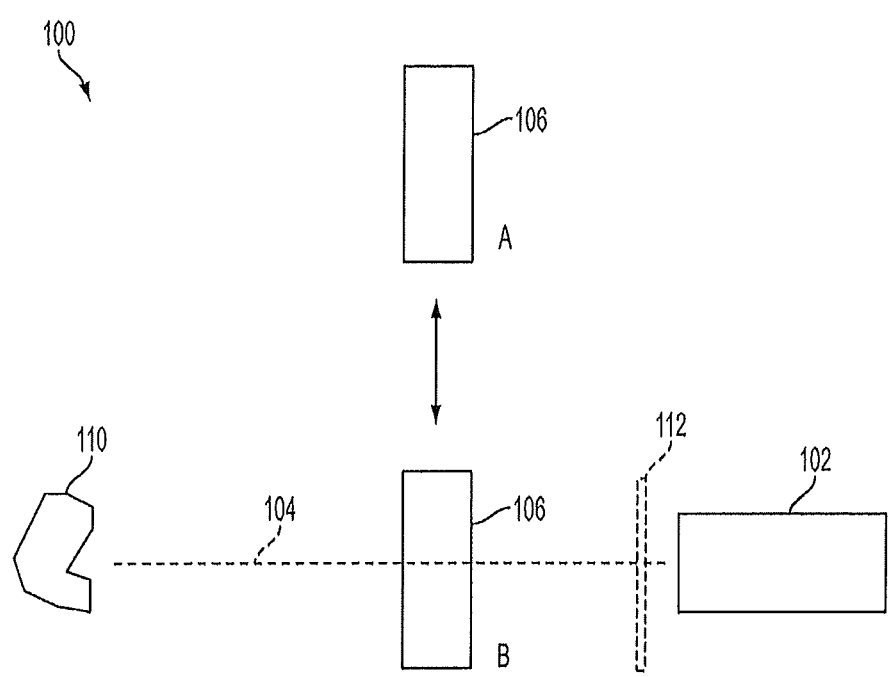
FIG. 1 shows an exemplary optical system for detecting light or an optical signal according to an exemplary embodiment.

FIG. 1 shows an exemplary optical system 100 for detecting light or an optical signal according to an exemplary embodiment. The optical system 100 includes a sensor 102, such as an optical sensor or optical detector. Light or optical signals propagating along the optical path 104 from a selected object or target 110 are detected at the sensor 102. In order to maintain sensor accuracy, a calibration apparatus 106 ("calibrator") is moved into the optical path 104. In an exemplary embodiment, the optical system 100 may operate in a sensing mode in which the calibration apparatus 106 is located at a first location A out of the optical path 104 of the optical sensor 102. The optical system 100 may also operate in a calibration mode in which the calibration apparatus 106 is moved to a second location B in the optical path 104 of the optical sensor 102. Once in the optical path 104, the calibration apparatus 106 blocks light or optical signals from the object 110 from reaching the optical sensor 102. The calibration apparatus 106 is then operated to provide light at one or more calibration wavelengths to the sensor 102 in order to calibrate the sensor 102. A filter 112 is shown that is placed between the calibration apparatus 106 and the sensor 102 when the calibration apparatus 106 is at second location B. The filter 112 allows a photon flux within a selected wavelength window corresponding to a calibration wavelength to reach the sensor 102 in order to calibrate the sensor 102 to the calibration wavelength. In an exemplary embodiment, a wavelength window is from about 3 microns to about 5 microns.

Figure 2:
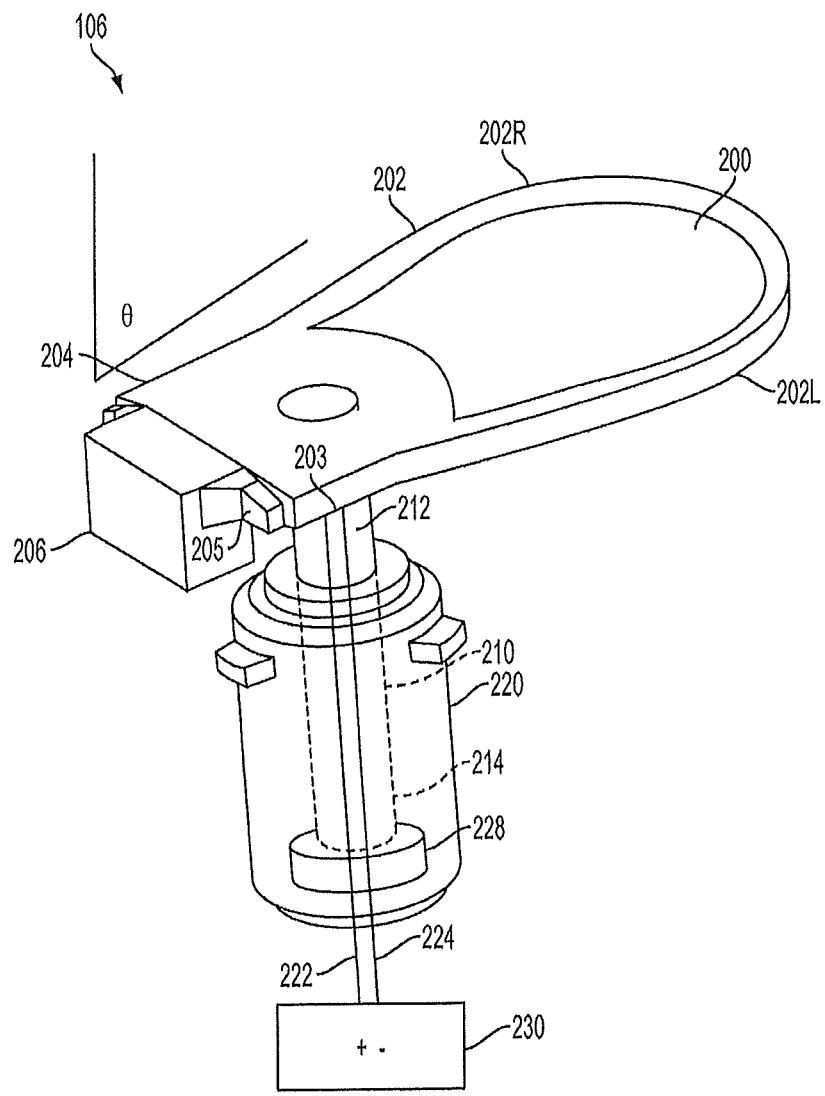
FIG. 2 shows a detailed view of the exemplary calibration apparatus shown in FIG. 1.

FIG. 2 shows a detailed view of the exemplary calibration apparatus 106 shown in FIG. 1. The exemplary calibration apparatus 106 includes a thin film structure 200 providing an extended surface area for emitting light or photons at a range of wavelengths. The thin film structure 200 may be bounded by a brace structure 202 that is coupled to the edges of the thin film structure 200. In an exemplary embodiment, the brace structure 202 is configured to apply a slight outward force in the plane of the thin film structure 200 in order to maintain a substantially flat surface of the thin film structure 200. Ends 203 and 204 of the brace structure 202 may be coupled or secured to a unit 206 via a securing device 205 such as a screw, bolt, etc. When secured to the unit 206, the ends 203 and 204 are further coupled to an upper end 212 of a rod 210. The rod 210 includes the upper end 212 for coupling to the thin film structure 200 via brace ends 203 and 204 and a lower end 214 extending within a housing 220. The rod 210 is rotatable within the housing 220 and an actuator assembly 228 of the housing 220 is used to rotate the rod 210 and hence the thin film structure 200 through a selected angle θ. The calibration apparatus 106 may be oriented with respect to the sensor 102 such that rotation of the rod 210 through angle θ moves the thin film structure 200 from a first location (e.g., location A in FIG. 1) to a second location (e.g., location B in FIG. 1). Alternatively, the calibration apparatus 106 may be linearly displaced between the first location and the second location.

In various embodiments, wires 222 and 224 traverses an interior of the rod and/or housing to the brace structure 202. Wire 222, disposed along a right side 202R of the brace structure 202, provides an electrical coupling to one edge of the thin film structure 200. Wire 224, disposed along a left side 202L of the brace structure 202, provides an electrical coupling to an opposing edge of the thin film structure 200. At a location distal to the brace structure 202, the wires 222 and 224 are coupled to opposing poles of a controllable power supply 230. Therefore, a current circuit is completed to provide current from the positive pole of the power supply 230 through wire 222 into the right side 202R of the brace structure 202, across the thin film structure 200 into wire 224 at the left side 202L of the brace structure 202, and into negative pole of the power supply 230. Variable voltage is supplied to the thin film structure 200 via the controllable power supply 230. In various aspects, applying a current to the thin film structure 200 raises a temperature of the thin film structure 200. At a selected temperature, the thin film structure 200 generally emits photons having a characteristic blackbody radiation spectrum, wherein the blackbody radiation spectrum includes a characteristic wavelength indicating a peak emission of the spectrum and that is related to the temperature of the thin film structure 200. In general, a total number of photons emitted by a blackbody radiator, as well as a number of photons emitted by the blackbody radiation within a selected range of wavelengths, are related to its temperature. As the temperature increases, the total photon flux and the photon flux within the selected wavelength range also increase. An operator may control the voltage or current at the controllable power supply 230 to cause a selected blackbody radiation spectrum to be emitted at the thin film structure 200. A characteristic wavelength and other features of the radiation spectrum is related to the magnitude or amount of the applied voltage. A photon flux within the selected range of wavelengths may then be measured at the optical sensor 102 to calibrate the optical sensor 102.

Figure 3:
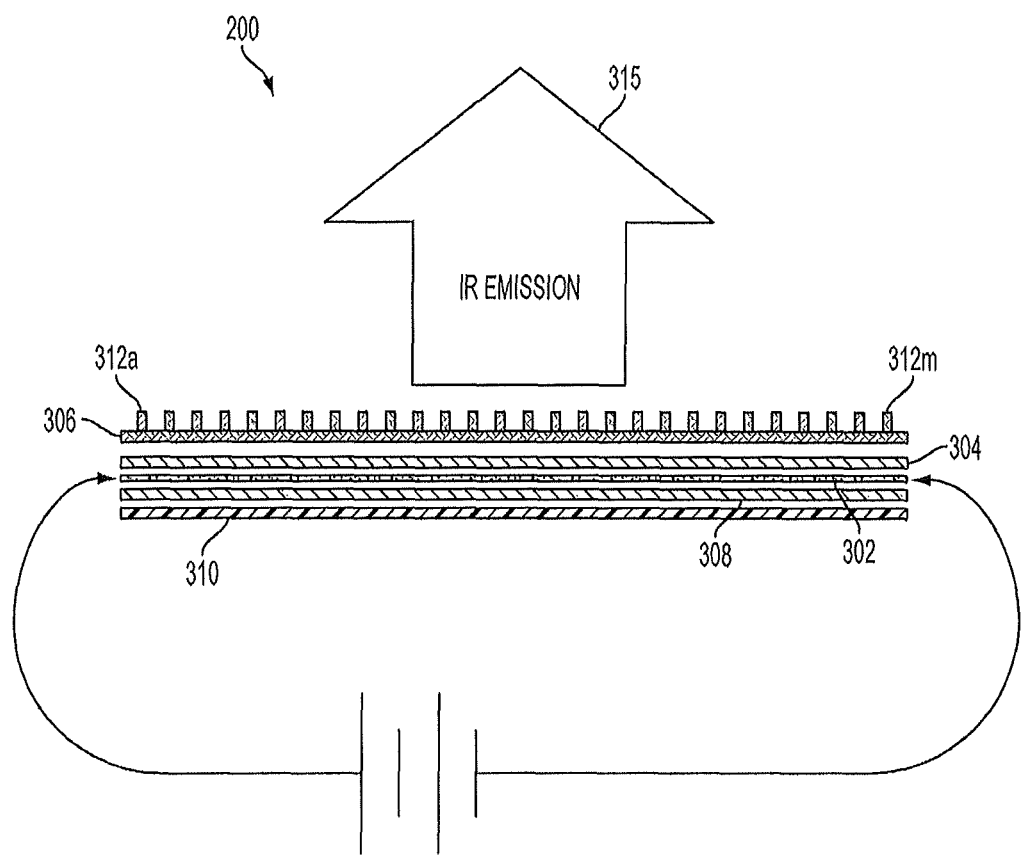
FIG. 3 shows a detailed view of the of the exemplary thin film structure of FIG. 2.

FIG. 3 shows a detailed view of the of the exemplary thin film structure 200 of FIG. 2. In an exemplary embodiment, thin film structure 200 includes a first carbon nanotube layer 302. The first carbon nanotube layer 302 includes a sheet of carbon nanotubes generally oriented to lie within the plane of the first carbon nanotube layer 302. One end of the first carbon nanotube layer 302 is coupled to a positive pole of a controllable power supply 320 and an opposing end of the first carbon nanotube layer 302 is coupled to a negative pole of the controllable power supply 320 in order to complete an electrical circuit through the first carbon nanotube layer 302. A first thermally conductive layer 304 is coupled to a top surface of the first carbon nanotube layer 302, wherein the top surface is the surface of the first carbon nanotube layer 302 facing toward the IR emission arrow 315. A second thermally conductive layer 308 is coupled to a bottom surface of the first carbon nanotube layer 302, wherein the bottom surface is the surface of the first carbon nanotube layer 302 facing away from the IR emission arrow 315. In various embodiments, the first and second thermally conductive layers 304 and 308 are made of an electrically insulating material such as a ceramic material. A second carbon nanotube layer 306 is coupled to the first thermally conductive layer 304 opposite the first carbon nanotube layer 302. The second carbon nanotube layer 306 is configured to emit photons in a selected direction as indicated by IR emission arrow 315 in response to heat generated at the first carbon nanotube layer 302. The second carbon nanotube layer 306 includes a plurality of carbon nanotubes 312a-312m oriented so that the longitudinal axes of the plurality of carbon nanotubes 312a-312m are substantially normal to the surface of the second carbon nanotube layer 306. In general, photons excited at the second carbon nanotube layer 306 are emitted into the half-space above the second carbon nanotube layer 306 containing the indicative IR emission arrow 315. Those photons that are emitted in the normal direction indicated by IR emission arrow 315 are used for calibration, as indicated by IR emission arrow 315. In various embodiments, emissivity of the second carbon nanotube layer 306 is greater than about 0.995. A low emissivity metal film 310 is coupled to a surface of the second thermally conductive layer 308 opposite the first carbon nanotube layer 302. In various embodiments, the low emissivity metal film 310 is configured to prevent heat from being radiated from the back end of the calibration apparatus thin film structure 200.

To operate the exemplary thin film structure 200, controllable power supply 320 supplies an electrical current to the first carbon nanotube layer 302 which generates heat in response to the supplied electrical current. The temperature and the amount of heat generated at the first carbon nanotube layer 302 are directly related to the amount of applied power. The first carbon nanotube layer 302 responds quickly to reach a selected equilibrium temperature when a current suitable for obtaining the equilibrium temperature is applied, as discussed below with respect to FIG. 4. In an exemplary embodiment, the first carbon nanotube layer 302 reaches an equilibrium temperature within seconds of applying current to the first carbon nanotube layer 302. The temperature at the surface of the first carbon nanotube layer 302 generally has a spatial variation described below with respect to FIG. 5. The spatial variation is in a temperature range of a few Kelvin. The heat generated at the first carbon nanotube layer 302 is dispersed through first thermally conductive layer 304 to excite photons at a broad range of wavelengths at the second carbon nanotube layer 306. The first thermally conductive layer 304 disperses heat generated at the first carbon nanotube layer 302 in the plane of the first thermally conductive layer 304. Thus, any variations in temperature and heat generation at the first carbon nanotube layer 302 are substantially smoothed once the heat reaches the second carbon nanotube layer 306. In various embodiments, the temperature at the second carbon nanotube layer 306 has a spatial variation of less than 1.0 Kelvin across the surface of the second carbon nanotube layer 306. In another embodiment, the spatial variation is less than 0.5 Kelvin. In yet another embodiment, the spatial variation is less than 0.1 Kelvin. Thus, each of the plurality of carbon nanotubes 312a-312m at the second carbon nanotube layer 306 receives substantially a same amount of heat from the first thermally conductive layer 304. The heat received at the second carbon nanotube layer 306 excites photons which are directed along the longitudinal axis of the plurality of carbon nanotubes 312a-312m and thus generally propagate along the direction indicated by IR emission arrow 315. In addition, a flux of photons is also emitted in off-normal directions. The resulting spectrum from the second carbon nanotube layer 306 therefore is substantially equivalent to a blackbody radiation spectrum for a conventional blackbody heated to a substantially uniform temperature.

Figure 4:
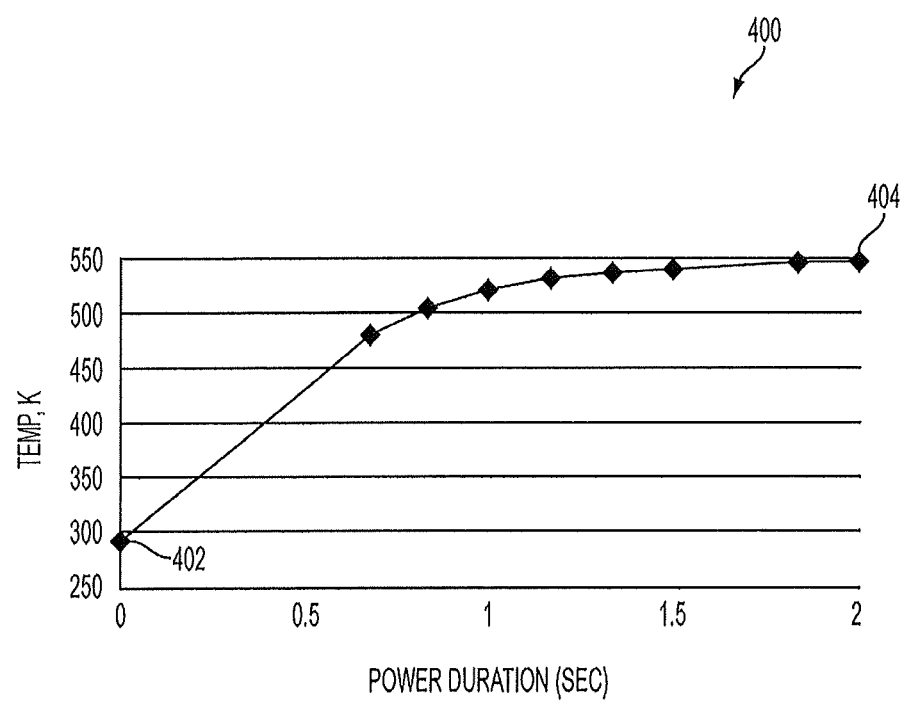
FIG. 4 illustrates a response time for achieving an equilibrium temperature when applying a current to an exemplary carbon nanotube film of the present disclosure.

FIG. 4 illustrates a response time for achieving an equilibrium temperature at the first carbon nanotube layer 302 when applying a current to an exemplary carbon nanotube film 200 of the present disclosure. Temperature is plotted along the ordinate axis in Kelvin and time is plotted along the abscissa in seconds. A voltage is applied to the first carbon nanotube layer 302 at time t=0 (402). Prior to time t=0 seconds, no current is supplied and the first carbon nanotube layer 302 is at a room temperature, i.e., about 290 K. Supplying the electrical current at time t=0 (402) causes the temperature of the first carbon nanotube layer 302 to rise to an equilibrium temperature of about 550 K at about t=2 seconds (404).

In contrast, conventional blackbody sources require from several minutes to several hours to reach an equilibrium temperature. Additionally, due to the length of time required to bring the conventional blackbody sources to an equilibrium temperature, the conventional blackbody sources are generally maintained at or near their equilibrium temperatures when not in calibration mode in order to be substantially prepared when calibration is needed. Calibration systems that use conventional blackbody sources therefore consume a large amount of power. Since the thin film structures of the present disclosure are able to reach equilibrium temperatures in relatively short time (i.e., less than about 20 seconds), there is no need to maintain the thin film structure at the equilibrium temperature during non-calibration times. Additionally, the thin film structure may thus be used to calibrate the sensors within an acceptable time frame, such as in less than 20 seconds. It is to be appreciated, however, that use of the thin film structure need not be limited to operations in which an expected time frame for completing a relevant task is 20 seconds or less. Therefore, calibrating optical sensors using the exemplary thin film structure of the present disclosure may be used on-demand which can save greater than about 90% of the operational costs over calibration methods using conventional blackbody sources.

FIG. 5 shows a table illustrating a relation between current supplied to the exemplary carbon nanotube film 200 and equilibrium temperatures of the first carbon nanotube layer 302 of the thin film structure 200. The first column indicates an amount of current (in Amps) applied to the first carbon nanotube layer 302. The second column indicates a target temperature (in Kelvin) that is expected to be achieved when the selected current is applied. Columns 3, 4 and 5 show measured temperatures (in Kelvin) achieved when the selected voltage is applied to the first carbon nanotube layer 302 at times of 10 seconds, 60 seconds and 180 seconds, respectively. Spatial variations in temperature are also shown by the second number provided in each of Columns 3, 4 and 5 (i.e., "±1," "±6," etc.). The actual temperatures show relatively small spatial variation in temperature and are stable over the shown times (i.e., 10 seconds, 60 seconds and 180 seconds). Spreading the heat from the first carbon nanotube layer 302 through the first thermally conductive layer 304 reduces the spatial variation to within a selected range that is less than about 1.0 Kelvin, about 0.5 Kelvin or about 0.1 Kelvin, in various embodiments. Thus, the second carbon nanotube layer 306 is uniformly heated and each of the plurality of carbon nanotubes 312a-312m emits a blackbody radiation spectrum corresponding to substantially the same temperature. Selecting the amount of current supplied to the first carbon nanotube layer 302 therefore substantially controls a blackbody radiation spectrum produced at the second carbon nanotube layer 306. Thus, over a suitable calibration time frame, the thin film structure can be used to provide a substantially blackbody radiation spectrum suitable for use in calibrating a sensor. In alternative embodiments, the spreading of the heat from the first carbon nanotube layer 302 through the first thermally conductive layer 304 can be used to reduce the spatial variation to within a range of about 2 Kelvin or about 3 Kelvin. It is to be appreciated that the thin film structure can be used to reduce the spatial variation of temperature to within about 1.0 Kelvin even in operations in which such reduction in spatial variation of temperature is not needed.

Due to the relatively quick response of the thin film structure to the applied power, the blackbody radiation spectrum provide by the calibration apparatus 106 may be altered in a relatively quick amount of time. Therefore, the calibration apparatus 106 may be used to quickly provide multiple blackbody radiation spectra to the sensor.

In an exemplary calibration process, a first voltage is sent through the first carbon nanotube layer 302 of the thin film structure 200 of the calibration apparatus 106 to generate a first set of photons of a first blackbody radiation spectrum. The sensor 102 is then calibrated to a first photon flux from the first blackbody radiation spectrum at a selected calibration wavelength, i.e., over a wavelength window corresponding to the selected calibration wavelength. Subsequently, a second voltage is sent through the thin film structure 200 to generate a second set of photons of a second blackbody radiation spectrum. The sensor 102 is then calibrated to the second photon flux from the second blackbody radiation spectrum at the selected calibration wavelength. This process may be repeated any number of times using the same thin film structure 200 to calibrate the sensor 102 at any number of photon fluxes at selected wavelengths before completing the calibration process. In alternate embodiments, a plurality of calibration wavelengths is used, and the plurality of photon fluxes is measured at each of the plurality of calibration wavelengths to calibrate the sensor. At the end of the calibration process, the calibration apparatus 106 is moved or rotated out of the optical path 104 of the sensor 102 so that the sensor 102 can be used for its intended purpose. The ability of the thin film structure 200 to provide multiple calibration wavelengths enables a smaller and lighter calibration apparatus design than known calibration apparatuses that use multiple conventional blackbody radiation sources.

Figure 6:
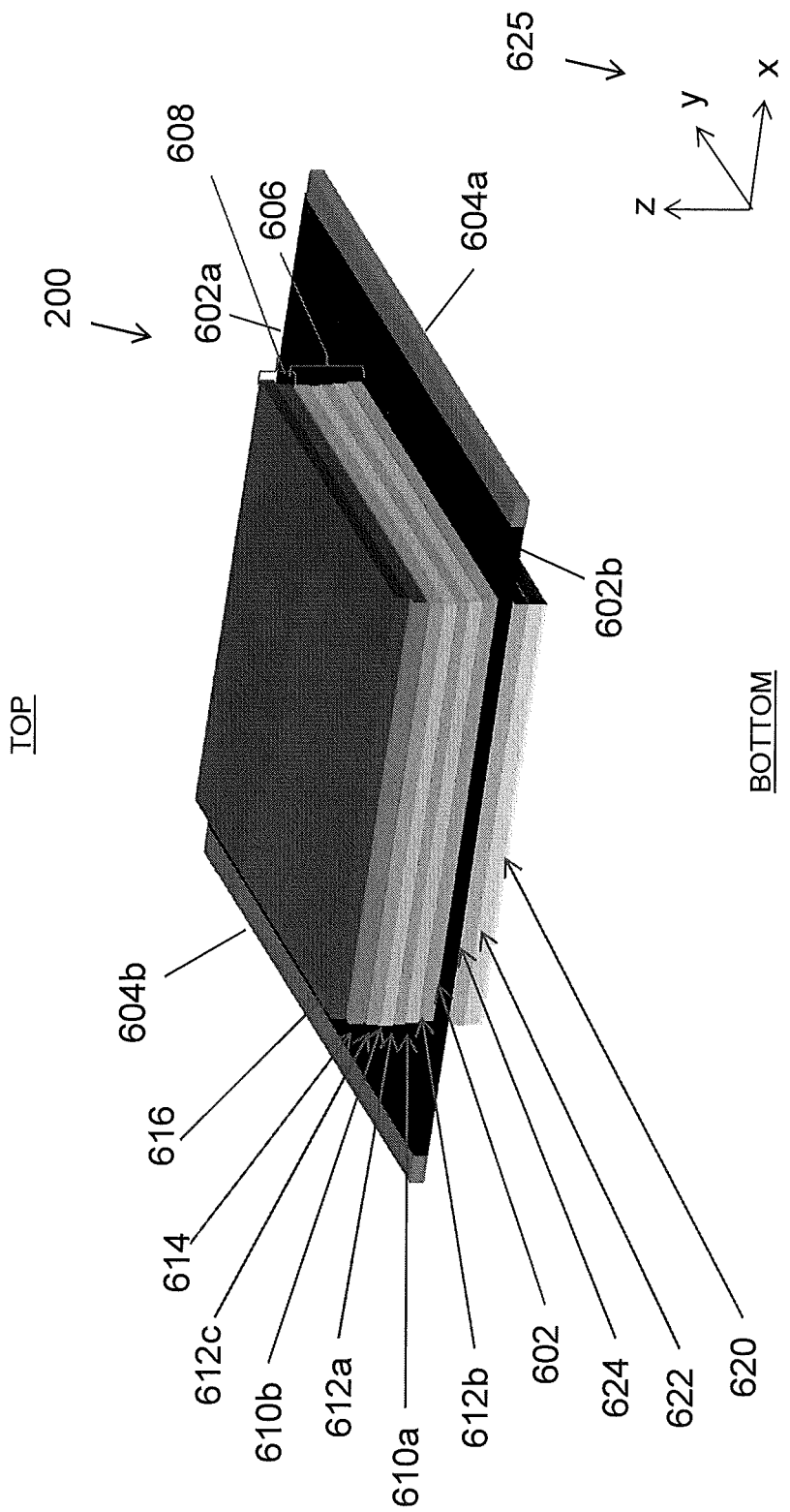
FIG. 6 shows a cross-sectional view of the thin film structure of the present disclosure in an alternate embodiment.

FIG. 6 shows a cross-sectional view of the thin film structure 200 of the present disclosure in an alternate embodiment. The thin-film structure 200 includes a first layer (referred to herein as a "first carbon nanotube layer 602") in electrical contact with electrodes 604a and 604b. The electrodes 604a, 604b may be connected to a power supply (not shown) in order to supply a current through the first carbon nanotube layer 602. A top side of the thin-film structure 200 and a bottom side of the thin-film device 200 are labelled in FIG. 6 for illustrative and explanatory purposes. The top side is generally in a positive z-direction as indicated by the coordinate system 625. The first carbon nanotube layer 602, as well as the other layers of the thin-film device 200, is considered to lie in the x-y plane of the coordinate system 625. The first carbon nanotube layer 602 includes carbon nanotubes that are oriented in the plane of the first carbon nanotube layer 602. When voltage is applied to the first carbon nanotube layer 602, heat is generated which flows out of either a top face 602a of the first carbon nanotube layer 602 or a bottom face 602b of the first carbon nanotube layer 602. Thermal spreading layer 606 is disposed on the top face 602a of the first carbon nanotube layer 602. A second carbon nanotube layer 608 (referred to herein as a "second carbon nanotube layer 608") is adjoined to the thermal spreading layer 606 so that the thermal spreading layer 606 is sandwiched between the first carbon nanotube layer 602 and the second carbon nanotube layer 608. The second carbon nanotube layer 608 includes a planar surface 614 that are aligned in the x-y plane and a plurality of carbon nanotubes 616 attached to a top of the planar surface 614 and aligned normal to the planar surface (i.e., with longitudinal axes of the plurality of carbon nanotubes 616 aligned in the z-direction). In one embodiment, the planar surface 614 is a layer of alumina substrate ($Al_2O_3$).

In operating the thin-film structure 200, an applied voltage generates heat at the first carbon nanotube layer 602. The heat is transmitted through the thermal spreading layer 606 to the second carbon nanotube layer 608. At the second carbon nanotube layer 608, the heat excites photons from the plurality of carbon nanotubes 616, which photons are emitted in the positive z-direction. The emitted photons generate a blackbody radiation spectrum.

The spatial distribution of heat generated by the first carbon nanotube 602 tends to vary within the x-y plane. A function of the thermal spreading layer 606 is to reduce this variation of heat within the x-y plane by the time the heat reaches the second carbon nanotube layer 608 so that the temperature and thus the photon emitted flux is even across the surface of the second carbon nanotube layer 608. The structure of the thermal spreading layer 606 is selected so as to achieve this reduction in spatial heat variation.

In particular, the thermal spreading layer 606 includes at least one graphene sheet for distributing heat emanating from the top face 602a of the first carbon nanotube layer 602. The graphene sheet is a compressed layer of graphene platelets. The graphene sheet conducts heat with high efficiency. Thus, the graphene sheet is a highly thermally anisotropic, meaning that heat flows in a plane of the graphene sheet according to a first thermal conductivity and flows normal to the plane of the graphene sheet according to a second thermal conductivity that is much less than the first thermal conductivity. As a result of this thermal anisotropy, graphene is used to reduce any spatial variations in heat density in the plane of the graphene. Since the graphene sheet is aligned in the x-y plane, the variations are smoothed in the x-y plane.

In one embodiment, the thermal spreading layer 606 includes a single graphene sheet between the first carbon nanotube layer 602 and the second carbon nanotube layer 608. In another embodiment, the thermal spreading layer 606 includes a stack of graphene sheets. In the illustrative embodiment of FIG. 6, the stack includes at least a first graphene sheet 610a and a second graphene sheet 610b. The first graphene sheet 610a and the second graphene sheet 610b may be joined by an adhesive layer 612a. The adhesive layer 612a is thermally insulating, although not necessarily thermally anisotropic, and allows heat transfer between the first graphene sheet 610a and the second graphene sheet 610b. Additionally, an adhesive layer 612b may be disposed between the first carbon nanotube layer 602 and the first graphene sheet 612a, and an adhesive layer 612c may be disposed between the second carbon nanotube layer 602 and the second graphene sheet 612b. The adhesive layers 612b and 621c may similarly be thermally insulating as, although not necessarily thermally anisotropic. As heat propagates away from the top face 602a of the first carbon nanotube layer 602, the heat is distributed throughout the first graphene sheet 610a in the x-y plane. The heat is then directed from the first graphene sheet 610a to the second graphene sheet 610b. The second graphene sheet 610b further distributes the heat in the x-y plane. Thus both the first graphene sheet 601a and the second graphene sheet 601b are employed in reducing spatial variation of heat in the x-y plane. While two graphene sheets are shown in FIG. 6, it is to be understood that any number of graphene sheets may be used in the thermal spreading layer 606 in other embodiments. The use of multiple graphene sheets helps to reduce the non-uniformity in the spatial variation of heat in the x-y plane.

The thin-film structure 200 further includes a reflector 620 disposed on the bottom face 602b of the first carbon nanotube layer 602. The reflector 620 directs heat emanating from the bottom face 602b back in the direction of the first carbon nanotube layer 602. The reflected heat thus passes through the thermal spreading layer 606 and is used to excite photons at the second carbon nanotube layer 608. In one embodiment, a graphene sheet 622 and adhesive layer 624 may be disposed between the first carbon nanotube layer 602 and the reflector 624. Thus, the reflected heat is spatially distributed by the graphene sheet 622.

The thin-film structure 200 of FIG. 6 is light weight, typically less than about 40 grams and has a thickness of about 25 mils (0.635 millimeters). Therefore, the thin-film structure may be used in various operations or equipment in which space is restricted and/or in which equipment weight is of concern. The temperature variation of the energy emitted from the top surface of the second carbon nanotube layer 608 is less than about 0.05 K across the surface of the second carbon nanotube layer 608.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for exemplary embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An apparatus for producing a blackbody spectrum, comprising:
    a first carbon nanotube layer configured to generate heat in response to an applied voltage;
    a second carbon nanotube layer configured to emit the blackbody radiation spectrum in response to the heat from the first carbon nanotube layer; and
    a thermal spreading layer between the first carbon nanotube layer and the second carbon nanotube layer, the thermal spreading layer including a graphene sheet configured to reduce a spatial variation of the heat in a plane of the thermal spreading layer.

2. The apparatus of claim 1, wherein the first carbon nanotube layer includes carbon nanotubes aligned in a plane of the first carbon nanotube layer.

3. The apparatus of claim 1, wherein the second carbon nanotube layer includes a planar surface and a plurality of carbon nanotubes, wherein a selected carbon nanotube has a longitudinal axis directed substantially normal to the planar surface and emits photons directed along the longitudinal axis in response to the heat from the first carbon nanotube layer.

4. The apparatus of claim 1, wherein the graphene sheet further comprises a graphene stack having at least a first graphene sheet and a second graphene sheet.

5. The apparatus of claim 4, further comprising a thermally insulating adhesive layer between the first graphene sheet and the second graphene sheet.

6. The apparatus of claim 1, further comprising a controllable power supply configured to apply the voltage to the first carbon nanotube layer.

7. The apparatus of claim 6, wherein a characteristic wavelength of the blackbody radiation spectrum is related to a magnitude of the applied voltage at the first carbon nanotube layer.

8. The apparatus of claim 1, further comprising a reflective layer disposed on a side of the first carbon nanotube layer opposite the thermal spreading layer.

9. The apparatus of claim 8, further comprising a graphene sheet disposed between the first carbon nanotube layer and the reflective layer.

10. A film structure for generating a blackbody radiation spectrum, comprising:
    a first carbon nanotube layer configured to generate heat in response to an applied voltage;
    a second carbon nanotube layer configured to emit the blackbody radiation spectrum in response to the heat from the first carbon nanotube layer; and
    a thermal spreading layer between the first carbon nanotube layer and the second carbon nanotube layer, the thermal spreading layer including a graphene sheet configured to reduce a spatial variation of the heat in a plane of the thermal spreading layer.

11. The film structure of claim 10, wherein the second carbon nanotube layer includes a planar surface and a plurality of carbon nanotubes, wherein a selected carbon nanotube has a longitudinal axis directed substantially normal to the planar surface and emits photons directed along the longitudinal axis in response to the heat from the first carbon nanotube layer.

12. The film structure of claim 10, wherein the graphene sheet further comprises a graphene stack having at least a first graphene sheet and a second graphene sheet.

13. The film structure of claim 12 further comprising a thermally insulating adhesive layer between the first graphene sheet and the second graphene sheet.

14. The film structure of claim 10, further comprising a thermally insulating adhesive layer disposed between the graphene sheet and the second carbon nanotube layer.

15. The film structure of claim 10, further comprising a reflective layer disposed on a side of the first carbon nanotube layer opposite the thermal spreading layer.

16. A method of producing a blackbody radiation spectrum, comprising:
    applying a voltage to a first carbon nanotube layer of a thin film device in order to generate heat at the first carbon nanotube layer, wherein the thin film device includes the first carbon nanotube layer, a second carbon nanotube layer and at least one graphene sheet disposed between the first carbon nanotube layer and the second carbon nanotube layer; and
    using the at least one graphene sheet to reduce a spatial variation of the heat in the plane of the thin film device, wherein the heat having the reduced spatial variation excites photons at the second carbon nanotube layer to produce the blackbody radiation spectrum.

17. The method of claim 16, wherein exciting photons at the second carbon nanotube layer further exciting a plurality of carbon nanotubes, wherein a selected carbon nanotube has a longitudinal axis directed substantially normal to a planar surface and emits photons directed along the longitudinal axis in response to the heat.

18. The method of claim 16, wherein the graphene sheet further comprises at least a first graphene sheet, a second graphene and a thermally insulating adhesive layer between the first graphene sheet and the second graphene sheet.

19. The method of claim 16, further comprising varying a magnitude of the applied voltage to select a characteristic wavelength of the blackbody radiation spectrum.

20. The method of claim 16, further comprising using a reflective layer of the thin film device to reflect heat from the first carbon nanotube layer into the graphene sheet.

* * * * *